(12) United States Patent
Bakehe-Ananga et al.

(10) Patent No.: US 8,709,857 B2
(45) Date of Patent: Apr. 29, 2014

(54) INTRINSIC ABSORBER LAYER FOR PHOTOVOLTAIC CELLS

(75) Inventors: Sylvie-Noelle Bakehe-Ananga, Truebbach (CH); Stefano Benagli, Neuchatel (CH)

(73) Assignee: Tel Solar AG, Trubbach (CH)

( * ) Notice: Subject to any disclaimer, the term of this patent is extended or adjusted under 35 U.S.C. 154(b) by 0 days.

(21) Appl. No.: 13/395,941

(22) PCT Filed: Nov. 11, 2010

(86) PCT No.: PCT/EP2010/067311
§ 371 (c)(1),
(2), (4) Date: Mar. 14, 2012

(87) PCT Pub. No.: WO2011/061113
PCT Pub. Date: May 26, 2011

(65) Prior Publication Data
US 2012/0270362 A1    Oct. 25, 2012

Related U.S. Application Data

(60) Provisional application No. 61/262,179, filed on Nov. 18, 2009, provisional application No. 61/266,739, filed on Dec. 4, 2009.

(51) Int. Cl.
*H01L 31/20* (2006.01)
(52) U.S. Cl.
USPC ................................ 438/87; 257/E31.024
(58) Field of Classification Search
USPC ........................................................ 438/87
See application file for complete search history.

(56) References Cited

U.S. PATENT DOCUMENTS

| 5,716,480 A | 2/1998 | Matsuyama et al. |
| 2008/0271675 A1 | 11/2008 | Choi et al. |
| 2009/0020154 A1* | 1/2009 | Sheng et al. .................. 136/255 |

OTHER PUBLICATIONS

Raniero et al. "Role of buffer layer on the performances of amorphous silicon solar cells with incorporated nanoparticles produced by plasma enhanced chemical vapor deposition at 27.12 MHz", Mar. 11, 2005, Thin Solid Films, 487 (2005) 170-173.*
International Search Report for PCT/EP2010/067311 dated Jul. 5, 2012.
International Preliminary Report on Patentability for PCT/EP2010/067311 dated Jul. 17, 2012.
Raniero, et al., "Role of Buffer Layer on the Performances of Amorphous Silicon solar Cells with Incorporated Nanoparticles produced by plasma enhanced chemical vapor deposition at 27.12 MHz", Thin Solid Films, Elsevier-Sequoia S.A., Lausanne, CH, vol. 487, No. 1-2, Sep. 1, 2005, pp. 170-173.
Platz, et al., "H2-Dilution vs. Buffer Layers for Increased Voc", Amorphous Silicon Technology, San Francisco, CA, Apr. 8-12, 1996.

* cited by examiner

*Primary Examiner* — Telly Green
*Assistant Examiner* — Damian A Hillman
(74) *Attorney, Agent, or Firm* — Pearne & Gordon LLP

(57) ABSTRACT

So as to manufacture an intrinsic absorber layer of amorphous hydrogenated silicon within a p-i-n configuration a solar cell by PeCvD deposition upon a base structure, thereby improving throughput an simultaneously maintaining quality of the absorber layer, a specific processing regime is proposed, wherein in the reactor for depositing the addressed absorber layer a pressure of between 1 mbar and 1.8 mbar is established and a flow of silane and of hydrogen with a dilution of silane to hydrogen of 1:4 up to 1:10 and generating an RF plasma with a generator power of between 600 W and 1200 W per 1.4 $m^2$ base structure surface to be coated.

14 Claims, 2 Drawing Sheets

INTRINSIC ABSORBER LAYER FOR PHOTOVOLTAIC CELLS

The present invention relates to a novel intrinsic absorber layer (i-layer), deposited at elevated deposition rates up to 6.6 Å/s and photovoltaic cells and modules containing said i-layer. It further relates to buffer layer arranged between the p- and i-layer of a p-i-n-configuration of a solar cell. Those intrinsic absorber layers can be used as absorber for single, double and triple junction amorphous silicon solar cells/modules and as top cells for micromorph solar cells/modules (=stacked combination of amorphous and microcrystalline cells).

BACKGROUND OF THE INVENTION

Prior Art FIG. 3 shows a basic, simple photovoltaic cell 40 comprising a transparent substrate 41, e.g. glass with a layer of a transparent conductive oxide (TCO) 42 deposited thereon. This layer is also called front contact and acts as first electrode for the photovoltaic element. The combination of substrate 41 and front contact 42 is also known as superstrate. The next layer 43 acts as the active photo-voltaic layer and exhibits three "sub-layers" forming a p-i-n junction. Said layer 43 comprises hydrogenated micro-crystalline, nanocrystalline or amorphous silicon or a combination thereof. Sub-layer 44 (adjacent to TCO front contact 42) is positively doped, the adjacent sub-layer 45 is intrinsic, and the final sub-layer 46 is negatively doped.

In an alternative embodiment the layer sequence p-i-n as described can be inverted to n-i-p, then layer 44 is identified as n-layer, layer 45 again as intrinsic, layer 46 as p-layer.

Finally, the cell includes a rear contact layer 47 (also called back contact) which may be made of zinc oxide, tin oxide or ITO and a reflective layer 48. Alternatively a metallic back contact may be realized, which can combine the physical properties of back reflector 48 and back contact 47. For illustrative purposes, arrows indicate impinging light. Solar cells, also known as photovoltaic cells, are semiconductor devices that convert electromagnetic energy, such as light or solar radiation, directly into electricity. The semiconductors used in the light absorbing layers of such cells are characterized by energy band gaps between their valence electron bands and their conduction electron bands ("midgap-material"). Free electrons usually cannot exist or remain in these band gaps.

When light is absorbed by said semiconductor material electrons in low-energy states (valence band) can be excited and jump the band gap to unoccupied higher energy states in the conduction band. Electrons excited to higher energy states leave behind unoccupied low-energy positions which are referred to as holes. These holes may shift from atom to atom in the semiconductor matrix and thus act as charge carriers in the valence band as do free electrons in the conduction band and thus contribute to conductivity. Most of the photons that are absorbed in the semiconductor create such electron-hole pairs. These electron-hole pairs generate photocurrent and, in the presence of a built-in field, the photovoltage of the solar cells.

Electron hole pairs produced by the light would eventually recombine, and convert to heat or a photon, unless prevented from doing so. To prevent recombination, a local electric field is created in the semiconductor by doping or interfacing dissimilar materials to produce a space charge layer. The space charge layer separates the holes and electrons for use as charge carriers. Once separated, these collected hole and electron charge carriers produce a space charge that results in a voltage across the junction, which is the photovoltage. If these separated hole and charge carriers are allowed to flow through an external load, they would constitute a photocurrent. Technically this is realized by establishing a thin p- and a n-doped semiconductor layer adjacent to the i-layer of a. m. p-i-n-structure. The i-layer or intrinsic layer exhibits the absorber behaviour for light and the generation of a. m. electron-hole pairs.

In practice, the semiconductor must be designed with a small band gap so that even photons from lower energy radiation can excite electrons to jump the band gap, but, in doing so, there are at least two negative effects that must be traded.

First, the small band gap results in a low photovoltage device, and thus low power output occurs. Secondly, the photons from higher energy radiation will produce many hot carriers with much excess energy that will be lost as heat upon immediate thermalization of these hot carriers to the edge of the conduction band.

On the other hand, if the semiconductor is designed with a larger band gap to increase the photovoltage and reduce energy loss caused by thermalization of hot carriers, then the photons from lower energy radiation will not be absorbed. Therefore, in designing conventional single junction solar cells, it is necessary to balance these considerations and try to design a semiconductor with an optimum band gap, realizing that in the balance, there has to be a significant loss of energy from both large and small energy photons.

Materials such as silicon with a band gap of 1.1 eV are relatively inexpensive and are considered to be good solar energy conversion semiconductors for conventional single junction solar cells.

The conversion efficiency of a solar cell is determined by the current of the cell, the voltage and the fill factor. The capacity of a cell to absorb light or the absorption coefficient of an intrinsic absorber layer determines the maximum density of current which can be achieved. It is very important to choose an absorber material which can absorb as much as possible of the incident light. Only photons with energy higher than the band gap of the absorber layer can be absorbed. The energy at which charge carriers are extracted from the cell determines the voltage of the cell. The fill factor is a quality factor which also indicates the fraction of carriers which recombine in the solar cell. The higher the fill factor, the higher is the quality of the absorber layer. If there are fewer defects in the absorber layer, there will be less centers of recombination, hence there will be less loss due to recombination.

In crystalline silicon the tetrahedral structure of a silicon atom with coordination number 4 is continued over a large range. In amorphous silicon the atoms form a continuous random network; therefore no long range order is present. This material has a disordered nature; not all atoms have a coordination number of 4. It appears that some defects, called dangling bonds, act as recombination centers and result from weak or broken bond of Si—H. These dangling bonds are responsible for the anomalous electrical behavior. To overcome the disorder, the material can be passivated by hydrogen. Hydrogenated amorphous silicon (a-Si:H) has a low amount of such defects, but unfortunately (a-Si:H) is associated with the Staebler-Wronsky Effect or light induced degradation (LID).

It has been shown that diluting the well known precursor gas silane with hydrogen has a beneficial effect on the quality of a-Si:H layers. It improves the order of the structure which is again beneficial for the stability of the optoelectronic material based on a-Si:H.

For layers deposited by PECVD, it has been shown that the hydrogen dilution decreases the growth rate for all known deposition techniques such as RF, DC, VHF. A growth rate of 4 Å/s has been achieved for films with a good stability. The films with best stability however have been deposited at a comparably lower growth rate of 2 Å/s.

A state-of-the-art deposition process results in an intrinsic layer deposited with a process gas dilution ratio of 1 (silane:hydrogen=1:1). Good efficiency results have been achieved with a deposition rate of 3.6 Å/s. Even higher deposition rates can be achieved by increasing the RF power during the deposition, but the layers' quality and uniformity decrease. The common advantage of thin film a-Si:H based solar cells is that they can been fabricated at low cost, however the deposition rate is comparably low.

The challenge is therefore to have a high quality intrinsic absorber layer (with few defects) and a suitable band gap. For decreasing the costs of solar cells a high throughput of the deposition systems is a key factor, since the absorber layer occupies the major part of any p-i-n solar cell structure. Hence the deposition rate of the absorber layer is very important.

For thin film solar cells it is important to achieve both high throughput and as much as possible high quality material. It helps decreasing the production cost and provides for a relative high efficiency. The known technologies face the problem of throughput and stability. The stability of devices can be improved by increasing the hydrogen dilution in the i-layer, but then the throughput is decreased. If the focus is laid on the throughput, the uniformity of the i-layer on a big surface (1.4 $m^2$ or more) suffers, because this last parameter is worsening when the power is increased for obtaining high rates.

It is one object of the present invention to improve throughput for and simultaneously maintaining quality of the addressed absorber layer.

Generically this is resolved by combining the pressure, the power and the gas flows to a new processing regime in such a way that one can overcome the uniformity and stability problem at an increased deposition rate.

This is achieved by a method of manufacturing an intrinsic absorber layer of amorphous hydrogenated silicon in a p-i-n configuration of a solar cell by PECVD depositing said layer upon a base structure for said layer in a reactor, said depositing comprising;
  establishing in said reactor a pressure of between 1 mbar and 1.8 mbar,
  establishing a flow of silane and of hydrogen with a dilution of silane to hydrogen of 1:4 up to 1:10
  generating a RF Plasma with a generator power of between 600 W and 1200 W per 1.4 $m^2$ base structure surface to be coated.

In one embodiment of the method according to the invention the addressed depositing is performed at a temperature of 200° C.

In one embodiment of the method according to the invention depositing is performed at a growth rate of 4.4 Å/s to 6.6 Å/s.

In one embodiment of the method according to the invention there is established one of:
  the pressure: 1 mbar and
  the flow of silane: 450 sccm per 1.4 $m^2$ base structure surface
  the flow of hydrogen: 2000 sccm per 1.4 $m^2$ base structure surface
  the power: 600 W per 1.4 $m^2$ base structure surface or, preferably
  the pressure: 1.8 mbar and
  the flow of silane: 450 sccm per 1.4 $m^2$ base structure surface
  the flow of hydrogen: 2000 sccm per 1.4 $m^2$ base structure surface
  the power: 1200 W per 1.4 $m^2$ base structure surface.

It is further an object of the invention to improve the stability of the intrinsic absorber layer. It is a known phenomenon that boron from the p-layer can diffuse into the adjacent i-layer, which is detrimental to its light absorption properties.

So as to additionally resolve this object in a further embodiment of the invention wherein there is valid:
  the surface of the base structure is the surface of a p-layer of the p-i-n cell and there is provided a buffer layer between the addressed surface of said p-layer and said absorber layer
  or
  the surface of the base structure is the surface of a n-layer of the p-i-n cell and there is provided a buffer layer between the addressed absorber layer and a subsequent layer to be deposited upon said absorber layer,
  depositing of the buffer layer of amorphous hydrogenated silicon is performed by an equal deposition process as deposition of the absorber layer with the following differing settings:
    the addressed pressure: ½ to ⅓ of the pressure established for depositing the absorber layer,
    the addressed flow of silane: ½ to ¼ of the flow of silane established for depositing the absorber layer,
    the addressed flow of hydrogen: 2-2.5 times the flow of hydrogen established for depositing the absorber layer,
    the addressed power: ½ to ⅓ of the power applied for depositing the absorber layer.

In the embodiment addressed last, there is further preferably added to the reactor space, for depositing said buffer layer, $CH_4$ gas.

In a further embodiment the addressed adding of $CH_4$ is performed at a flow of ⅔ of the flow of silane$_4$.

In a further embodiment of the invention the absorber layer is deposited with a thickness of between 100 nm and 600 nm, preferably of between 150 nm and 300 nm.

Still in a further embodiment having a buffer layer the buffer layer is deposited with a thickness of between 5 nm to 15 nm, preferably of between 7 nm and 11 nm.

In a further embodiment of the invention having a buffer layer deposited, the ratio of deposition rate for the buffer layer to deposition rate for the absorber layer is selected to be between 1:7 and 1:5.

It is also an object of the invention to improve the stability of the intrinsic absorber layer. It is a known phenomenon that boron from the p-layer can diffuse into the adjacent i-layer, which is detrimental to its light absorption properties.

This object is resolved by a method of manufacturing a buffer layer of amorphous hydrogenated silicon between an intrinsic absorber layer of amorphous hydrogenated silicon in a p-i-n solar cell and the p-layer of such p-i-n solar cell, by PECVD depositing said buffer layer in a reactor on a base structure comprising
  establishing in the reactor a pressure of between 0.3 mbar and 0.9 mbar,
  establishing in the reactor a flow of silane between 180 sccm and 225 sccm per 1.4 $m^2$ of base structure surface to be coated,
  establishing in the reactor a flow of hydrogen of between 4000 sccm and 5000 sccm per 1.4 $m^2$ of base structure surface to be coated,
  generating an RF Plasma with a generator power of between 200 W and 600 W per 1.4 $m^2$ base structure surface to be coated.

In an embodiment of the just addressed method there is added to the reactor space for depositing said buffer layer $CH_4$ gas.

In a further embodiment such adding $CH_4$ gas is performed at a flow of ⅔ of the flow of silane.

SUMMARY OF THE INVENTION

The inventive method for manufacturing an amorphous layer in a semiconductor thin film solar cell comprises a specific relation of RF power per substrate size to silane flux to hydrogen flux at an overall pressure level between 1 mbar and 1.8 mbar which be kept constant for a range of certain RF power levels while high throughput, good uniformity and layer-stability can be reliably achieved.

Figure 3:
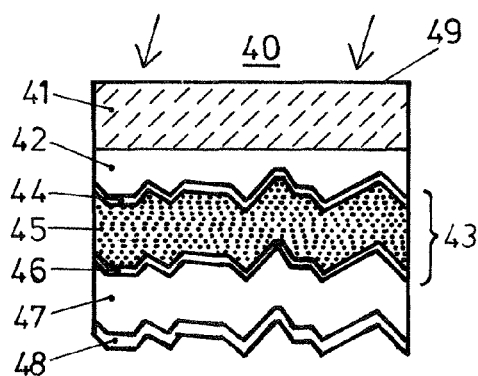
FIG. 3: A photovoltaic cell according to the prior art.

For better cell performance, a buffer layer can be introduced adjacent to p-layer 44 (cf. FIG. 3) comprising a-Si:H with a low carbon content. Due to its functionality it can be regarded a related part of the i-layer 45. Such buffer layer should be grown slowly (with low deposition rate) in order to prevent boron (from the adjacent p-layer 44) to contaminate the i-layer. In addition to the function of blocking impurities the buffer layer can enhance the $V_{OC}$ of the p-layer if the composition is chosen properly. Different studies have shown that a properly chosen buffer can enhance the initial performance of a PV cell.

DETAILED DESCRIPTION OF THE INVENTION

The disclosed invention aims at solving the throughput problem without affecting the uniformity. A negligible loss in the module/cell performance compared to a standard state-of-the-art process is acceptable while the degradation coefficient remains the same.

The disclosed invention further aims at improving the performance of thin film silicon photovoltaic cells.

Figure 1A:
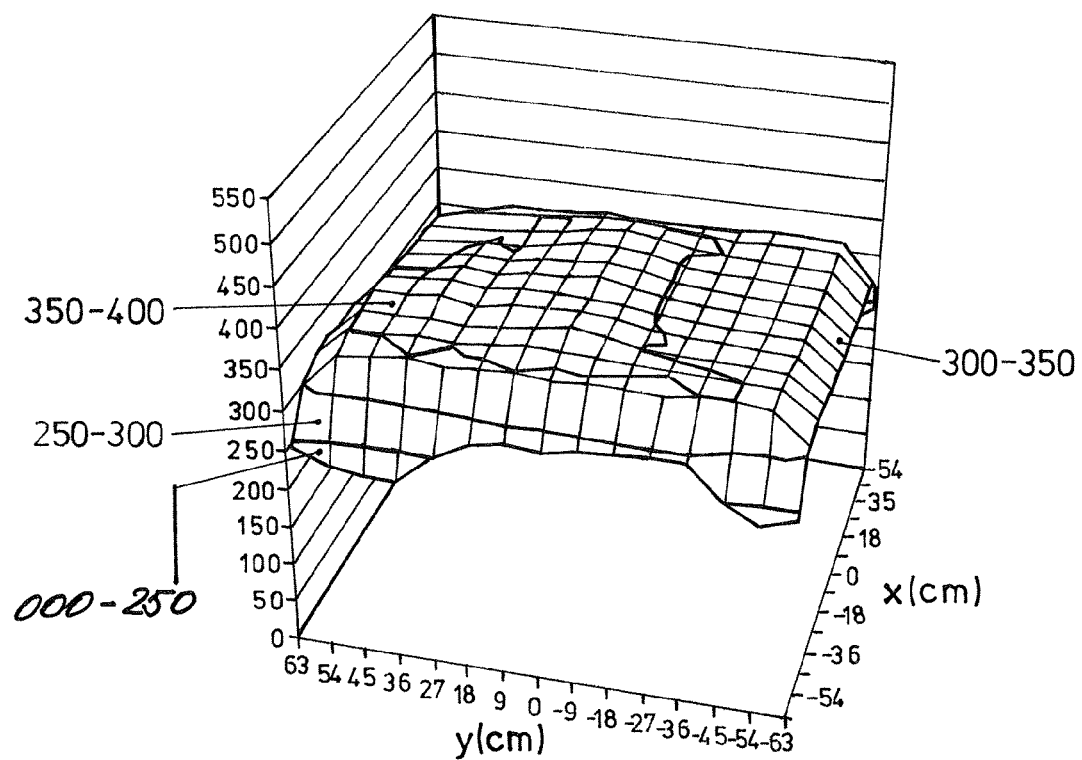
FIG. 1a: Uniformity and deposition rate of the new a-Si:H absorber layer, measured by ellipsometry.

The present invention relates to a photovoltaic cell or module comprising an intrinsic amorphous silicon absorber layer prepared with a dilution of process gas silane:hydrogen of 1:4 up to 1:10. The intrinsic layer (i-layer) has been fabricated with a growth rate of up to 6.6 Å/s, FIG. 1 on a rigid, flat substrate (glass) with a good stability and good uniformity at 200° C. deposition temperature by PECVD. Thereby FIG. 1a shows uniformity and deposition rate of the new a-Si:H absorber layer, measured by ellipsometry in a 13×15 point raster. There prevails:

| Min: (nm) | 310.88 |
| Max: (nm) | 367.89 |
| Average: | 350.15 |
| Uniformity: (%) | 8.40 |
| t: (s) | 500.00 |
| Deposition Rate: (A/s) | 6.6 |
| Std.dev (%): | 2.42 |

This invention contributes to fabricate solar cells or modules with high throughput in the production, high efficiency and consequently low production cost. A module with output power of 122 W was fabricated on a TCO ZnO front contact for a module size of 1.4 $m^2$, FIG. 2.

Figure 2:
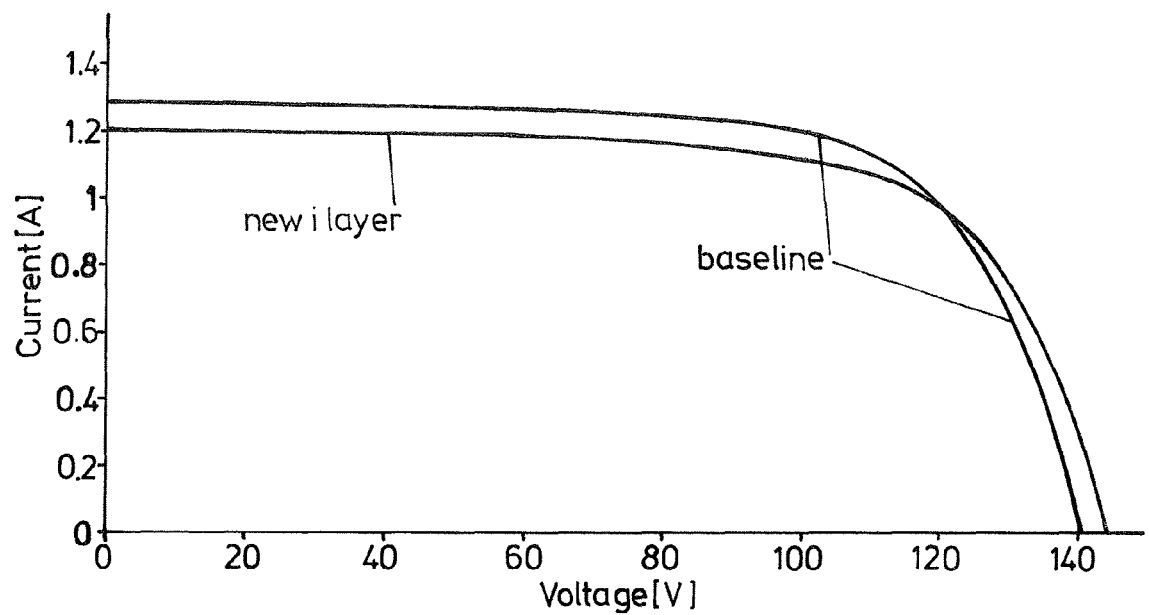
FIG. 2: Comparison between a baseline module and a module with an i-layer according to the invention. Both modules have a back reflector and the same i layer thickness (wbr).

FIG. 2 shows a comparison between a baseline module and a module with an i-layer according to the invention. Both modules have a back reflector and the same i layer thickness (wbr).

For the new i-layer there prevails:
Power: 122 W
App. Eff.: 9.4%
Active Area Eff.: 9.1%
Voc: 143.7 V
Voc/cell: 910.5 mV
Isc: 1.233 A
Jsc: 14.62 $mA/cm^2$
FF: 68.3%
Rs: 15.44 Ohm
Rp: 3721 Ohm.

For the base line there prevails:
Power: 124 W
App. Eff.: 9.58%
Active Area Eff.: 9.28%
Voc: 141 V
Voc/cell: 887 mV
Isc: 1.278 A
Jsc: 15.17 $mA/cm^2$
FF: 68.9%
Rs: 14.68 Ohm
Rp: 4431 Ohm.

This result is of the same level as a state-of-the-art module. The same degradation coefficient for the cells prepared with the new i-layer according to the invention has been observed as in the state of the art. (20-25% degradation in efficiency depending of the i-layer thickness and the hydrogen dilution of the absorber layer).

The band gap has been found to be wider. From external quantum efficiency measurements the band gap of this new i layer has found to be 1.69 eV compared to 1.66 eV for the i-layer used on the baseline recipe in state of the art. This can be seen from the $V_{OC}$ and $J_{SC}$ for cells/modules and makes the new i-layer suitable to be used in single, double and triple junction amorphous silicon solar cells/modules and as top cells for micromorph solar cells/modules. The manufacturing process is faster and therefore cheaper despite a module performance loss of just 2 W.

The RF power given in the following table represents the output power of the RF generator. The actual power in the plasma depends on the cable length between generator and plasma process chamber. Therefore a correction factor has to be applied for different cable length. For a standard PECVD deposition system like a Kai 1-1200 (available from Oerlikon Solar) the deposition conditions of the i-layer for each reactor are:

| | I layer A-Si:H | | |
|---|---|---|---|
| RF Power (W) | 600 | 1200 | 1200 |
| Pressure (mbar) | 1 | 1.8 | 2.5 |
| $SiH_4$ (sccm) | 450 | 450 | 480 |
| $H_2$ (sccm) | 2000 | 2000 | 4500 |
| Deposition rate (Å/s) | 4.4 | 6.6 | 4.96 |
| Uniformity (%) | 8.8 | 8.4 | 10.6 |

Various studies have shown that normally high RF power levels will result in increased deposition rate and improved layer density. Improved density is beneficial for stability, in other words, less degradation is to be expected. On the other hand, uniformity of the deposited layer will deteriorate. However, all three criteria are crucial: high throughput, good uniformity and layer-stability.

The inventors' efforts showed that there is no need for sacrificing one of the goals for the two others. From the table above one can learn that for a 1.4 m$^2$ substrate to be coated a silane flow of 450 sccm and hydrogen flow of 2000 sccm is sufficient to result in a constantly highly uniform (8.8% or better) layer, whereas the RF power can be increased from 600 to 1200 W and a respective deposition rate between 4.4 to 6.6 Å/s can be maintained. In other words, in this specific process window even a doubled RF power level does not result in deterioration of the layer uniformity. As the third column shows, a further increase of hydrogen and silane flow (at an elevated overall pressure) will not automatically result in an increase of deposition rate and/or uniformity.

The exact values above shall not limit the scope of the invention. The relation of RF power per substrate size silane flux:hydrogen flux at an overall pressure level between 1 and 1.8 mbar can be translated to other substrate sizes with comparable results. The RF power can be varied accordingly, as described above.

Further optimization of cell efficiency regarding the $V_{OC}$ has been achieved by a new buffer layer composition. This buffer layer is being arranged between the p-layer 44 and i-layer 45 (buffer NOT displayed in FIG. 3). The new buffer enhances the p/i interface of the p-i-n layer stack or solar cell/module respectively without negative impact for the throughput. This buffer layer has been deposited at 30% less deposition rate than Prior Art recipes. The buffer layer has been deposited with a hydrogen dilution of 20 (silane:hydrogen=1:20). To enhance the $V_{OC}$ of the cell/module CH$_4$ was added to the process gas flow of the buffer layer, up to 39% of SiH$_4$+CH$_4$ flow.

Some studies have shown that CH$_4$ in i-layers enhance the initial measured cell performance, but deteriorate the layer quality as consequently an enhanced LID is observed later.

With the buffer layer according to a further embodiment of the invention an enhanced initial efficiency could be realized. A negative influence in LID was not observed. Depending on the i-layer thickness 20-25% degradation was observed.

In an experimental embodiment the buffer layer thickness was selected to be 9 nm. The deposition time for this new buffer in the cell/module recipe is accordingly 100 s. This however is not detriment compared to Prior Art recipes in terms of throughput, since the increase a-Si:H deposition rate as described above compensates this effect.

The deposition conditions for the buffer layer for each reactor are:

|  | New buffer |
| --- | --- |
| RF Power (W) | 299 |
| Pressure (mbar) | 0.5 |
| SiH$_4$ (sccm) | 208 |
| H$_2$ (sccm) | 4160 |
| CH$_4$ (sccm) | 134 |
| Deposition rate (Å/s) | 0.92 |
| Uniformity (%) | 15.14 |

The buffer layer according to an embodiment of the invention is being deposited

The exact values above shall not limit the scope of the invention. The relation of RF power per substrate size: silane flux:hydrogen flux:methane flux at an overall pressure level at essentially 0.5 mbar can be translated to other substrate sizes with comparable results. The thickness of the buffer layer may be varied +/−2 nm.

Figure 1B:
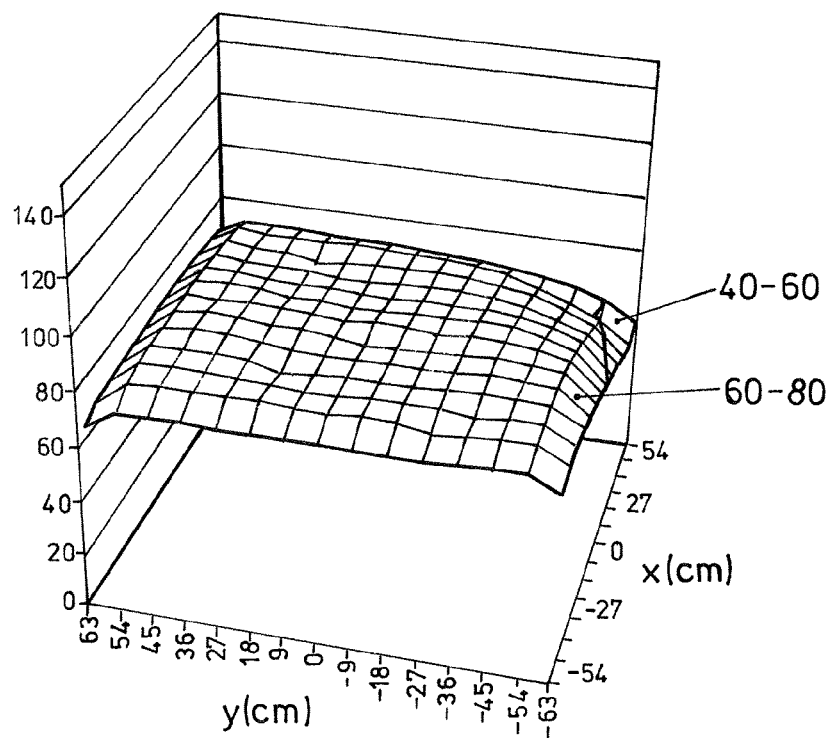
FIG. 1b: Uniformity and deposition rate of the new buffer layer, measured by ellipsometry.

Further data is displayed in FIG. 1b). This fig. shows uniformity and deposition rate of the new buffer layer, measured by ellipsometry in a 13×11 point raster on a 1100×1300 substrate. There prevails:

| Min: (nm) | 58.56 |
| --- | --- |
| Max: (nm) | 79.46 |
| Average: | 75.23 |
| Uniformity: (%) | 15.14 |
| USEC: (%) | 27.78 |
| t: (s) | 800.00 |
| Deposition Rate: (Å/s) | 0.94 |
| Std.dev (%): | 3.95 |

As mentioned before the new buffer layer can be inventively combined to achieve an overall improved intrinsic absorber layer system. Such buffer layer system comprises a low-rate deposited a-Si:H buffer with traces of carbon plus a high-rate deposited a-Si:H bulk absorber layer. The bulk absorber (i-) layer is being chosen between 100 nm to 600 nm, preferably between 150-300 nm. The buffer layer is deposited to a thickness between 5 nm to 15 nm, preferably 7 nm to 11 nm. The deposition rates ratio (low-rate process depo rate: high-rate process depo rate) has been found to be advantageously chosen essentially between 1:7 and 1:5. The gas flux ratios as described for the buffer layer can be advantageously combined with the ratios described for the bulk i-layer above.

An embodiment of the invention is being realized for an a-Si:H buffer layer system followed by a bulk-absorber (i-) layer a-Si:H, wherein the following ratios shall be valid:

| Ratios | New buffer | Bulk (i-) absorber |
| --- | --- | --- |
| RF Power | 1 | 2-3 |
| Pressure | 1 | 2-3 |
| SiH$_4$ | 1 | 2-2.5 |
| H$_2$ | 2-2.5 | 1 |
| CH$_4$ | 1 | 0 |
| Deposition rate | 1 | 5-7 |

What is claimed is:

1. A method of manufacturing an intrinsic absorber layer of amorphous hydrogenated silicon in a p-i-n configuration of a solar cell by PECVD depositing of said intrinsic absorber layer upon a base structure surface for said intrinsic absorber layer in a reactor space, said PECVD depositing comprising:
 establishing in said reactor space a pressure range of between 1 mbar and 1.8 mbar,
 establishing in said reactor space a flow of silane and a flow of hydrogen with a dilution of silane to hydrogen of 1:4 up to 1:10,
 generating a RF Plasma with a generator power range of between 600 W and 1200 W per 1.4 m$^2$ of the base structure surface to be coated,
wherein the base structure surface is a surface of an n-layer of the p-i-n configuration of the solar cell, further comprising a step of providing a buffer layer of amorphous hydrogenated silicon between the intrinsic absorber layer and a subsequent p-layer to be deposited upon the intrinsic absorber layer, said buffer layer being deposited by an equal deposition process as the PECVD depositing of the intrinsic absorber layer with the following differing settings:
- a pressure ½ to ⅓ times the pressure established for depositing the intrinsic absorber layer,
- a flow of silane ½ to ¼ times the flow of silane established for depositing the intrinsic absorber layer,
- a flow of hydrogen 2 to 2.5 times the flow of hydrogen established for depositing the intrinsic absorber layer,
- a generator power ½ to ⅓ times the generator power applied for depositing the intrinsic absorber layer.

2. A method of manufacturing an intrinsic absorber layer of amorphous hydrogenated silicon in a p-i-n configuration of a solar cell by PECVD depositing of said intrinsic absorber layer upon a base structure surface for said intrinsic absorber layer in a reactor space, said PECVD depositing comprising:
- establishing in said reactor space a pressure range of between 1 mbar and 1.8 mbar,
- establishing in said reactor space a flow of silane and a flow of hydrogen with a dilution of silane to hydrogen of 1:4 up to 1:10,
- generating a RF Plasma with a generator power range of between 600 W and 1200 W per 1.4 m² of the base structure surface to be coated, wherein the base structure surface is a surface of a p-layer of the p-i-n configuration of the solar cell and there is provided a buffer layer of amorphous hydrogenated silicon between the surface of the p-layer and the intrinsic absorber layer, said buffer layer being deposited by an equal deposition process as the PECVD depositing of the intrinsic absorber layer with the following differing settings:
- a pressure ½ to ⅓ times the pressure established for depositing the intrinsic absorber layer,
- a flow of silane ½ to ¼ times the flow of silane established for depositing the intrinsic absorber layer,
- a flow of hydrogen 2 to 2.5 times the flow of hydrogen established for depositing the intrinsic absorber layer,
- a generator power ½ to ⅓ times the generator power applied for depositing the intrinsic absorber layer.

3. The method of one of claim 1 or 2, comprising performing said PECVD depositing at a growth rate of 4.4 Å/s to 6.6 Å/s.

4. The method of claim 1 or 2 comprising performing said PECVD depositing at a temperature of 200° C.

5. The method of claim 1 or 2, comprising establishing for the PECVD depositing of the intrinsic absorber layer:
- said pressure: 1.8 mbar;
- said flow of silane: 450 sccm per 1.4 m² of the base structure surface;
- said flow of hydrogen: 2000 sccm per 1.4 m² of the base structure surface; and
- said generator power: 1200 W per 1.4 m² of the base structure surface.

6. The method of claim 1 or 2, further comprising adding a $CH_4$ gas to said reactor space, for depositing said buffer layer of amorphous hydrogenated silicon.

7. The method of claim 6, further comprising adding said $CH_4$ gas at ⅔ times the flow of silane.

8. The method of claim 1 or 2, wherein said intrinsic absorber layer is deposited with a thickness of between 100 nm and 600 nm.

9. The method of claim 1 or 2, wherein said buffer layer of amorphous hydrogenated silicon is deposited with a thickness of between 5 nm to 15 nm.

10. The method of claim 1 or 2, comprising selecting a ratio of deposition rate for said buffer layer of amorphous hydrogenated silicon to deposition rate for said intrinsic absorber layer to be between 1:7 and 1:5.

11. The method of claim 1 or 2, comprising establishing for the PECVD depositing of the intrinsic absorber layer:
- said pressure: 1 mbar;
- said flow of silane: 450 sccm per 1.4 m² base structure surface;
- said flow of hydrogen: 2000 sccm per 1.4 m² base structure surface; and
- said generator power: 600 W per 1.4 m² base structure surface.

12. A method of manufacturing a buffer layer of amorphous hydrogenated silicon between an intrinsic absorber layer of amorphous hydrogenated silicon in a p-i-n configuration of a solar cell and a p-layer of said p-i-n configuration of the solar cell, by a PECVD depositing of said buffer layer of amorphous hydrogenated silicon in a reactor space on a base structure surface comprising:
- establishing in said reactor space a pressure range of between 0.3 mbar and 0.9 mbar;
- establishing in said reactor space a flow range of silane between 180 sccm and 225 sccm per 1.4 m² of the base structure surface to be coated;
- establishing in said reactor a flow range of hydrogen of between 4000 sccm and 5000 sccm per 1.4 m² of the base structure surface to be coated; and
- generating an RF Plasma with a generator power range of between 200 W and 600 W per 1.4 m² of the base structure surface to be coated, wherein said buffer layer being deposited by an equal deposition process as the PECVD depositing of the intrinsic absorber layer with the following differing settings:
- a pressure ½ to ⅓ times the pressure established for depositing the intrinsic absorber layer,
- a flow of silane ½ to ¼ times the flow of silane established for depositing the intrinsic absorber layer,
- a flow of hydrogen 2 to 2.5 times the flow of hydrogen established for depositing the intrinsic absorber layer,
- a generator power ½ to ⅓ times the generator power applied for depositing the intrinsic absorber layer.

13. The method of claim 12, comprising adding a $CH_4$ gas to said reactor space for depositing said buffer layer of amorphous hydrogenated silicon.

14. The method of claim 13, comprising adding said $CH_4$ gas at a flow of ⅔ times the flow of silane.

* * * * *